United States Patent [19]
Malloy

[11] 4,340,858
[45] Jul. 20, 1982

[54] TEST FIXTURE

[75] Inventor: James T. Malloy, Huntington Beach, Calif.

[73] Assignee: Philip M. Hinderstein, Irvine, Calif.

[21] Appl. No.: 66,093

[22] Filed: Aug. 13, 1979

[51] Int. Cl.³ .......................... G01R 1/06; G01R 31/02
[52] U.S. Cl. ............................... 324/158 P; 324/72.5; 324/158 F
[58] Field of Search ............... 324/158 F, 158 P, 72.5; 339/17 L, 176 MP; 220/20; 206/561, 562

[56] References Cited

U.S. PATENT DOCUMENTS

| | | | |
|---|---|---|---|
| 1,916,984 | 7/1933 | Naken | 206/562 |
| 2,558,124 | 6/1951 | Burden | 220/20 |
| 3,330,982 | 7/1967 | Dickson, Jr. | 324/158 P |
| 3,969,010 | 7/1976 | Nailor et al. | 339/176 MP |
| 3,996,514 | 12/1976 | Brown et al. | 324/158 P |

FOREIGN PATENT DOCUMENTS 2617190 2/1976 Fed. Rep. of Germany ... 324/158 P

OTHER PUBLICATIONS

Cuevas et al., "Miniature Contacting", IBM Tech. Dis. Bull., vol. 12, No. 2, Jul. 1969, p. 301.
Morton et al., "High-Performance . . . ", IBM Tech. Dis. Bull., vol. 18, No. 3, Aug. 1975, pp. 749–750.

Primary Examiner—Ernest F. Karlsen
Attorney, Agent, or Firm—Philip M. Hinderstein

[57] ABSTRACT

In an in-circuit test fixture of the type including a bed of pins, first ends of which are adapted to contact a circuit board, means for supporting the pins, and means for making electrical connection thereto, there is disclosed an improvement wherein the pins are solid members and are freely slideable in the supporting means and wherein the test fixture includes a sheet of resilient material engaging second ends of all of the pins for providing the force necessary to urge the pins into contact with the circuit board. The means for supporting the pins includes a modular assembly which forms channels for the pins and eliminates the necessity for drilling holes in a board. The modular assembly includes a circuit board and a plurality of spring contacts for making electrical connection to the solid pins.

27 Claims, 6 Drawing Figures

TEST FIXTURE

BACKGROUND OF THE INVENTION

1. Field of the Invention

The present invention relates to a test fixture and, more particularly, to an in-circuit test fixture for use in making a non-functional electrical inspection of individual components and/or circuit paths on a printed circuit board or wired backpanel assembly.

2. Description of the Prior Art

The present invention is concerned with the testing of printed circuit (PC) boards, primarily the testing of PC boards before and/or after the individual components have been mated thereonto and connected.

There are basically only two types of PC board testers, namely in-circuit and functional. All early automatic test systems were functional testers, i.e. connections were made only to the input and output terminals of the board and signals were conducted to the input terminals which simulated the input signals the PC board would experience in an assembled unit. The output terminals were monitored to determine whether or not the entire board was functioning properly.

While this approach was and still is very effective in separating good and defective PC boards, it is ineffective in isolating the cause of the test failure of defective boards. As a result, troubleshooting at a manual station is still required.

To overcome this shortcoming of functional testers, a totally different approach to PC board testing was developed, what is herein referred to as an in-circuit tester. The in-circuit tester does not approach testing on an input/output basis. Rather, testing is achieved by making contact with each electrical point on a circuit board and sequentially monitoring each and every circuit component and each and every circuit path. In this manner, solder shorts, opens, missing parts, wrong parts, backwards or improperly seated parts, and out-of-tolerance parts may be isolated and identified.

A complete in-circuit test system includes a simple sequencer-type controller which switches from component to component on a PC board while monitoring that component's performance. Programming can be done very simply using microprocessors and/or minicomputers.

The most critical part of an in-circuit test system is the test fixture which must be configured for each part to be tested. The test fixture has the responsibility of making a reliable electrical connection from the controller to every node on the circuit board. This is typically done by using a bed of pressure pins that contact the foil side of the circuit board. A number of schemes exist for keeping the board in contact with the pins during test. This can be done manually or through the use of a vacuum-actuated fixture, both of which are well known in the art and maintain and distribute a holddown force evenly over the board.

A typical bed-of-pins fixture uses a blank panel with holes drilled on the same matrix as the PC board to be tested. The hole sizes are large enough to accommodate a sleeve which has a square tail extruded on the end for wire wrapping. A spring-loaded contact pin is inserted into the sleeve for making contact with the PC board. The fixture also has holes drilled on the other end of the board and solid feedthrough-type pins are installed which make contact with a transition head. The transition head usually has spring-loaded contacts which are the same as those which mate with the test PC board. The centers of the contacts on the transition head and feedthrough contacts on the interface part of the fixture are the same so that they will mate.

The bed-of-pins test fixture provides a reliable method of testing for electrical defects. It provides the user with a simple and highly productive way of testing thousands of circuits in less than a minute in some instances. The main disadvantage with this system is cost. In most cases, a bed-of-pins fixture is cost prohibitive due to the high cost of the spring-loaded contacts and necessary accessories.

This being the case, the most widely used method of testing PC boards requires an operator to review a wire list or artwork to determine how the circuit should be connected. The operator must then proceed to touch a set of probes to all common circuits to verify their connection. The operator must also verify that circuits that are uncommon are not connected. A simple battery and light with positive and negative leads can be used and a buzzer is sometimes used as an ohmmeter. The disadvantages of this approach are great. Error is almost surely introduced by the operator. The time required to test a single circuit board is lengthy and the results of such test will always be open for criticism.

Since all of the systems for testing circuit boards have some disadvantage, it is very often the case that circuit boards are not tested prior to delivery to the customer. The user merely tries to use the board and work around problems, if possible. If the problems cannot be overcome, the circuit board is simply discarded and replaced.

In summary, all of the methods discussed above have one thing in common, i.e. they are cost prohibitive. Most cannot be used unless the quantities of product are large enough to support the large amounts of money required for necessary tooling. On the other hand, those not requiring high tooling costs, slow down production and result in high labor costs. The current testing methods, while adequate at times, do not meet industry's needs most of the time. Thus, it becomes obvious that other more economical test methods must be created.

SUMMARY OF THE INVENTION

According to the present invention, there is provided a bed-of-pins in-circuit test fixture which solves these problems in a manner unknown heretofore. The present in-circuit test fixture is cost effective. It can be used when only small or moderate numbers of PC boards have to be tested. The present test fixture eliminates the necessity of drilling holes in a support plate and, most importantly, eliminates the necessity for using spring-loaded pins. The support plate is put together in a modular fashion and solid pins may be utilized.

According to the present invention, a mat of rubber or some other resilient material is used to support straight, solid pins. Its primary function is to provide flexibility and contact force in the same manner as a spring does in the spring pins currently used. Contact force and contact pin travel can be altered simply by using different materials in the compliant mat. Contact force can be lightened by using a more compliant material whereas it can be increased by using a resilient, yet stiffer material. Contact travel can be varied by using a soft foam material under the compliant mat. The softer material will yield at a rapid rate and when fully compressed, the compliant mat will then exert the required force to make contact with the PC board under test. Contact force and contact travel may be changed or altered to meet design requirements. This feature allows greater flexibility in user design and application.

Straight solid pins are used to make contact with the PC board under test. They may be made from any material, in any desired shape. The means for supporting the pins comprises a plurality of elongate members defining a series of parallel, spaced, U-shaped channels being open on the same sides thereof and a plurality of planar boards, one side of each board contacting the open sides of one of the channels for enclosing same. By stacking these members and boards, a two dimensional array of square compartments can be made for receipt of square, elongate, solid pins. A two dimensional test fixture can be made up using spacer blocks to any given design. This method of fixture assembly allows a manufacturer to draw on premolded compartments of various grids and fashion fixtures of any design, at will.

Electrical connection to the pins is accomplished by forming one side of each board with a pattern of electrical leads thereon extending from a first set of terminal pads adjacent the various channels to a second set of terminal pads positioned for external connection. A plurality of spring contacts engage the planar boards and extend into the channels, each of the spring contacts being positioned to engage one of the first set of terminal pads and one of the pins for completing an electrical circuit therebetween. Current is passed from the printed circuit board to the contacts and into the opposite side of the board so that when the solid pins rub against the contacts, electrical connection is achieved.

OBJECTS, FEATURES AND ADVANTAGES

It is therefore an object of the present invention to solve the problems which have heretofore prevented the manufacture of a cost effective, bed-of-pins type in-circuit test fixture. It is a feature of the present invention to solve these problems by the use of solid, moveable pins and a sheet of resilient material engaging the pins for providing the force necessary to urge the pins into contact with a PC board under test. An advantage to be derived is that the extreme expense of spring-loaded pins is eliminated. A further advantage is that contact force and contact pin travel can be readily altered.

It is a further feature of the present invention to solve these problems by a novel method of forming the pin supporting means and for making sliding electrical connection to the pins. An advantage is that solid pins may be used and no connection need be made thereto. A further advantage is that a fixture can be made up using spacer blocks to any given design. A still further advantage is that a manufacturer can draw on premolded compartments of various grids and can fashion fixtures of any design at will.

Still other objects, features, and attendant advantages of the present invention will become apparent to those skilled in the art from a reading of the following detailed description of the preferred embodiments constructed in accordance therewith, taken in conjunction with the accompanying drawings, wherein like numerals designate like parts in the several figures and wherein:

DESCRIPTION OF THE PREFERRED EMBODIMENTS

Referring now to the drawings and, more particularly, to FIGS. 1-4 thereof, there is shown an in-circuit test fixture, generally designated 10, for testing loaded and/or unloaded PC boards, such as PC board 11. Test fixture 10 is for use in a conventional in-circuit test system including a sequencer/controller and means for holding board 11 against fixture 10. Since these components of a test system are well known to those skilled in the art, they will not be discussed further herein.

Test fixture 10 is, generally speaking, of the bed-of-pins type in which a bed of pressure pins contact the noncomponent side of PC board 11. That is, in common with other test fixtures, test fixture 10 includes a bed of pins 12, first ends of which are adapted to contact PC board 11, means 13 for supporting pins 12, and means for making electrical connection thereto. However, this is where the similarity between test fixture 10 and prior art test fixtures ends since significant improvements are made with regard to each of these components.

More specifically, and in accordance with the preferred embodiment of the present invention, conventional spring-loaded pins are replaced by solid pins, generally designated 12, which are moveable with regard to the supporting means, generally designated 13. The force necessary to urge the ends of pins 12 into contact with the terminal points on PC board 11 is generated by a compliant mat 14 positioned below supporting means 13. Mat 14 is a sheet of rubber or some other resilient material which is cut or molded to size. The actual dimensions of mat 14 will depend on the size of pins 12 and the requirements of test fixture 10. The features of mat 14 will be described more fully hereinafter subsequent to a description of supporting means 13.

Figures 1, 2:
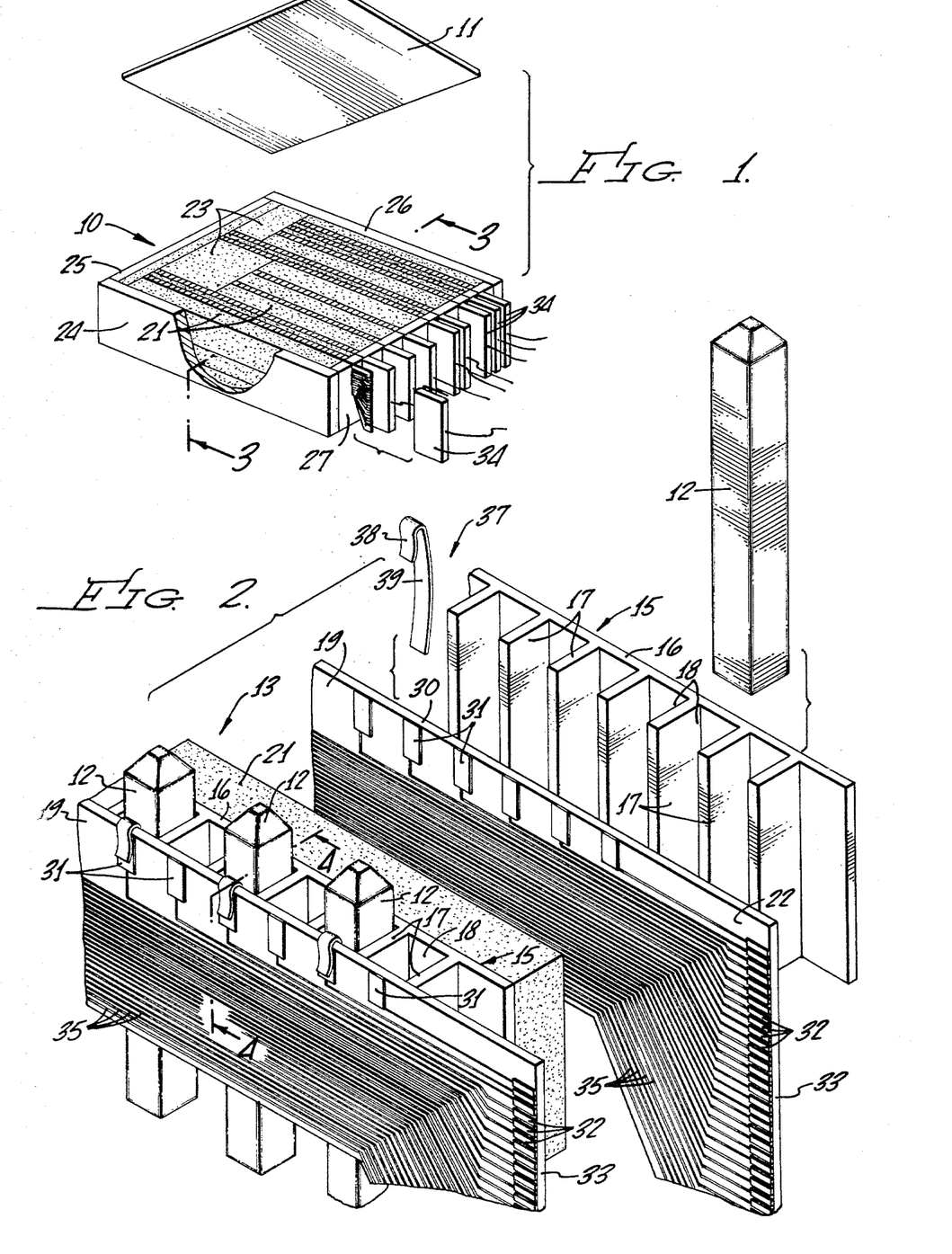
FIG. 1 is a perspective view of a test fixture constructed in accordance with the teachings of the present invention.
FIG. 2 is an enlarged, exploded, perspective view of a portion of the test fixture of FIG. 1.

In a conventional test fixture, the pins are supported by drilling holes in a support plate on the same matrix as PC board 11. With the present invention, the necessity for drilling a board is eliminated. That is, pins 12 are supported by a supporting means 13 which is assembled from two elements, generally designated 15 and 19. Element 15 is an elongate member including a planar portion 16 and a series of parallel, spaced portions 17 extending perpendicularly from one side of portion 16. In this manner, member 15 defines a series of parallel, spaced, U-shaped channels 18, all of which are open on the sides thereof opposite portion 16. Member 19, on the other hand, is a planar board similar in shape and dimensions to portion 16 of member 15. Board 19 is adapted to be positioned with one side 20 thereof in contact with the free ends of portions 17 of member 15 so as to enclose channels 18, as shown in the lefthand side of FIG.

2. Thus, the combination of members 15 and 19 defines enclosed square compartments 18 for receipt of pins 12.

Both members 15 and 19 can readily be molded from a suitable plastic material, in any desired lengths, with any desired spacing between compartments 18, so that pins 12 have any desired center-to-center spacing. In order to form a two dimensional array of pins 12, as in a conventional bed-of-pins fixture, a member 15 having the desired size is selected and the length is determined simply by cutting off any unnecessary length of portion 16. Using elongate spacer blocks 21 to adjust the spacing between adjacent rows of pins 12 or not using spacer blocks if not required so that the other side 22 of a board 19 could contact an adjacent portion 16 of an adjacent member 15, one dimension of test fixture 10 can be established. The other dimension of test fixture 10 may be established by using large rectangular spacer blocks 23, as shown in FIG. 1, to eliminate unnecessary lengths of members 15 and 19. After the desired arrangement of pins is established by using any number of members 15 and 19 and spacer blocks 21 and 23, the entire assembly is clamped between four side panels 24–27 which are clamped together in any suitable manner. It should be evident that this method of fixture assembly would allow a manufacturer to draw on premolded compartments of various grids and fashion a fixture 10 of any design at will.

Figure 3:
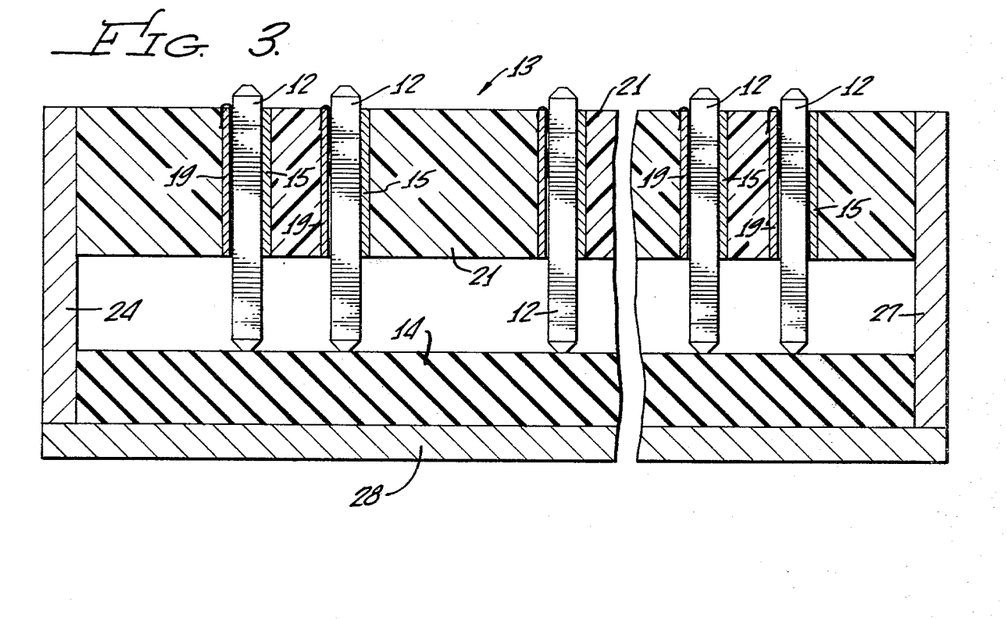
FIG. 3 is an enlarged, partial, sectional view taken along the line 3—3 in FIG. 1.

Fixture 10 also includes a bottom panel 28, shown in FIG. 3, on which compliant mat 14 rests. It should be evident from an inspection of FIG. 4 that the depth of panels 24–27 is significantly greater than the depth of members 15, 19, 21, and 23, so as to provide a space between the bottom of members 15 and 19 and bottom panel 28 for insertion of mat 14.

The actual size of compartments 18 is very important. The cross-sectional dimensions and the length of channels 18 must be large enough to allow pins 12 freedom of movement. However, side-to-side slope must be held to a minimum. Members 15 and 19 should be at least half as thick as pins 12 are long. The reason for this is to reduce the possibility of pins 12 seizing in compartments 18 and not returning to their static positions after a test. Channels 18 are preferably square in shape as are pins 12.

Figure 4:
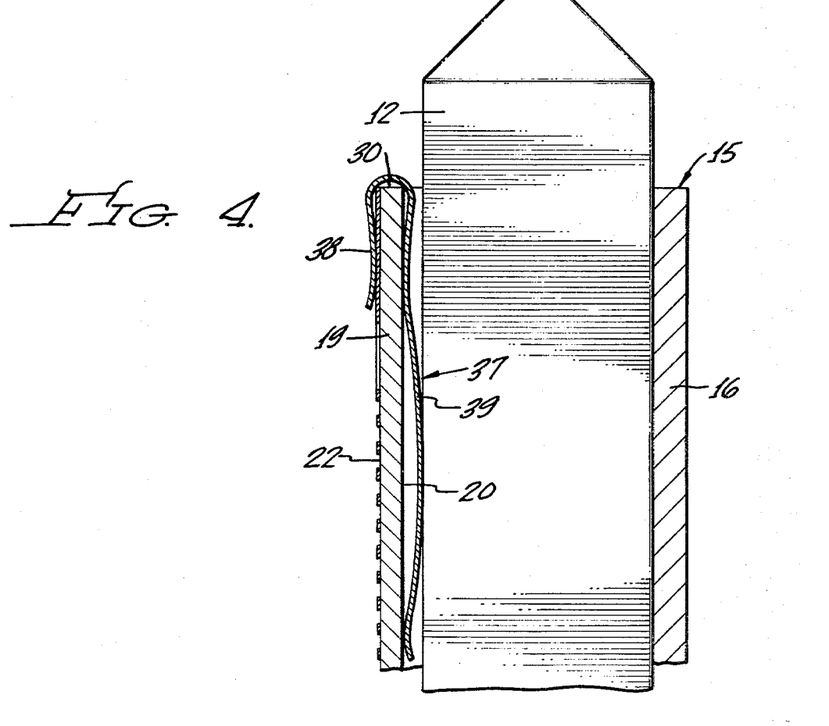
FIG. 4 is an enlarged sectional view taken along the line 4—4 in FIG. 2.

As mentioned briefly previously and as can now be seen from an inspection of FIG. 4, pins 12 are solid members which are freely slideable within channels 18 and the lower ends thereof rest on mat 14. When PC board 11 is brought into contact with the free ends of pins 12, pins 12 compress mat 14 and mat 14 provides the force necessary to hold pins 12 against PC board 11. The contact force and the travel of pin 12 can be altered by using different materials in mat 14. The contact force can be lightened by using a more compliant material. Conversely, the contact force can be increased by using a resilient, yet stiffer material that will exert greater resistance to pressure.

Pins 12 are preferably straight solid pins made from any suitable material. The main concern is to avoid shapes that will seize in channels 18. Thus, pins 12 can be square, round, or have a hexagonal cross-section. The pins 12 may be of any length desired and may be made from any material that offers the designer/user the desired strength and conductivity requirements. Even insulated materials could be used if a non-electrical contact was required.

It is obvious that in order to complete a test fixture, electrical connection must be made to each of pins 12. Because pins 12 are not spring-loaded pins as used heretofore but rather are solid moveable pins, it is not advantageous to attach a wire directly to pins 12. With the present invention, the necessity of attaching a wire directly to pins 12 is eliminated by the use of a circuit board and a double contact.

More specifically, and as shown most clearly in FIGS. 2 and 4, member 19 is in fact a circuit board having a pattern of electrical leads preferably printed on side 22 thereof, which side is isolated from all of compartments 18. More specifically, the pattern of electrical leads on side 22 of board 19 includes a first series of parallel, spaced, electrical terminal pads 31 which are positioned along edge 30 of board 19. Edge 30 is part of the top surface of test fixture 10 so that pads 31 are aligned with channels 18 formed in member 15. In fact, as shown in FIG. 2, one pad 31 is positioned adjacent the center of the channel 18 of the adjacent member 15. The pattern of electrical leads also includes a second series of parallel, spaced, electrical terminal pads 32 which are positioned along an edge 33 of board 19, edge 33 preferably being at one end of board 19. This arrangement permits the edges 33 of all of boards 19 to extend through the side panel 27 of test fixture 21 where electrical connection can be made to all of terminal pads 32 by the use of a conventional edge card connector 34. Thus, by the simple expedient of connecting an edge card connector 34 to edge 33 of each board 19, electrical connection can simultaneously be made to all of pads 32.

The pattern of electrical leads on side 22 of board 19 also includes a series of conductive lines 35, one conductive line 35 connecting one of pads 32 to one of pads 31. Thus, the connection of an edge card connector 34 to edge 33 of a board 19 in effect makes electrical contact with each of terminal pads 31.

As stated previously, a pad 31 is positioned adjacent and opposite from each of channels 18. In order to connect each pad 31 to the pin 12 positioned within its corresponding channel 18, a plurality of spring contacts 37 are used. As shown in FIGS. 2 and 4, each spring contact 37 is a generally hook-shaped member which is designed to fit over edge 30 of board 19 so as to extend on the opposite sides 20 and 22 thereof. One side 38 of spring contact 37, the shorter side thereof, contacts electrical terminal pad 31, as shown. The other side 39 of contact 37, the longer side thereof, extends along side 20 of board 19, along one wall of channel 18. As shown in FIG. 4, the solid pins 12 rub along side 39 of contact 37 so that an electrical connection is achieved.

It is obvious therefore that current flows from PC board 11, to pins 12, to sides 39 of spring contacts 37, over the top edge 30 of board 19 to sides 38 of contacts 37, into terminal pads 31, via electrical lines 35 to terminal pads 32, and then to edge card connector 34. Obviously, current can flow in the opposite direction to provide input signals from test fixture 10 to PC board 11.

It should be apparent to those skilled in the art that a great flexibility is achieved in designing a test fixture using the present invention. The combination of the use of straight solid pins 12, a modular construction of supporting means 13, and circuit boards 19 and spring contacts 37 highly simplify and significantly decrease the cost of manufacturing test fixture 10. Any one of these elements alone would provide a significant improvement over prior art fixtures. Thus, compliant mat 14 could be eliminated and conventional spring pins used to generate the contact force with boards 19 and spring contacts 37 utilized to make electrical connection to the pins 12. However, straight solid pins 12 and compliant mat 14 are preferred.

Figure 5:
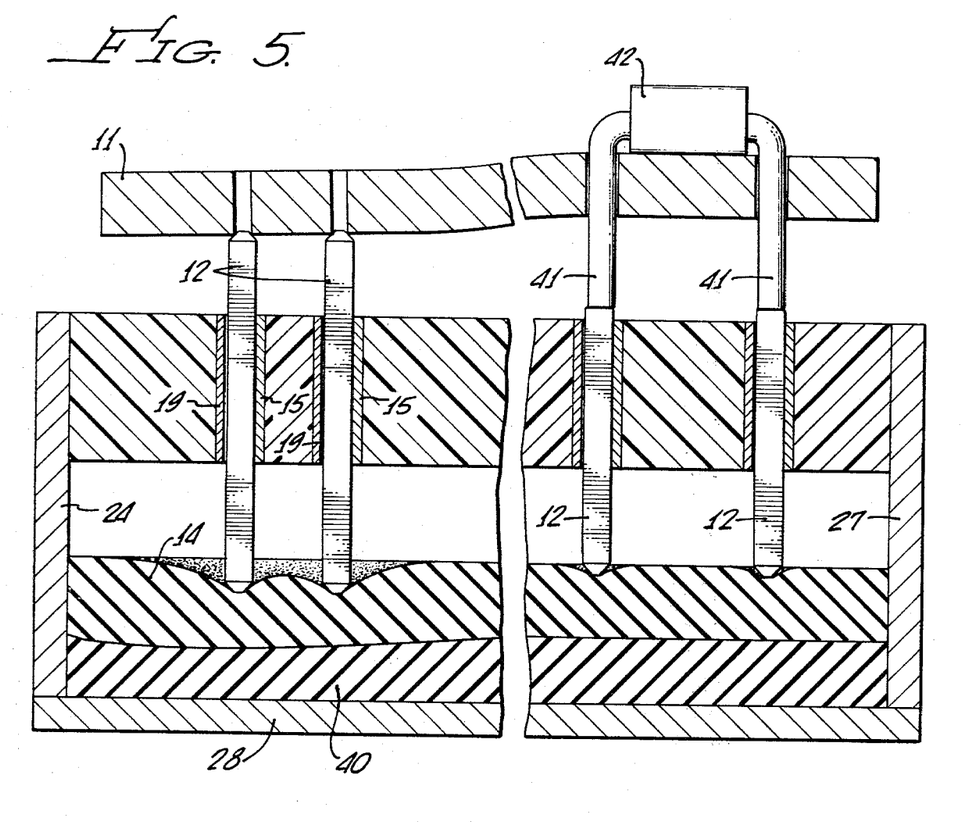
FIGS. 5 and 6 are enlarged, partial, sectional views, similar to FIG. 3, showing some of the additional features of the present invention.

Another advantage of using compliant mat 14 is that pin travel can be varied by using a soft foam material under mat 14. In other words, as shown in FIG. 5, a second sheet of rubber or foam or some other resilient material 40 may be positioned between mat 14 and bottom panel 28 of fixture 10. The softer material will yield at a rapid rate but when fully compressed, mat 14 will then exert the required force to make contact with PC board 11. This feature allows greater flexibility in user design and application.

The advantages to be derived from such a system can be seen from an inspection of FIG. 5. Specifically, pins 12 can be made in different lengths to cover those circumstances where some pins 12 contact the bottom side of PC board 11 whereas other pins 12 contact leads 41 extending through board 11 after components 42 are connected to board 11. Secondly, in the case of a warped board or the like, it would be necessary for pins 12 at one end of fixture 10 to move by a greater distance than the pins 12 at the other end of fixture 10. This is readily handled utilizing the present invention, as shown in FIG. 5, since soft foam mat 40 will readily compress to absorb this increased travel distance, but mat 14 will still provide the necessary force to urge all of pins 12 against PC board 11.

Figure 6:
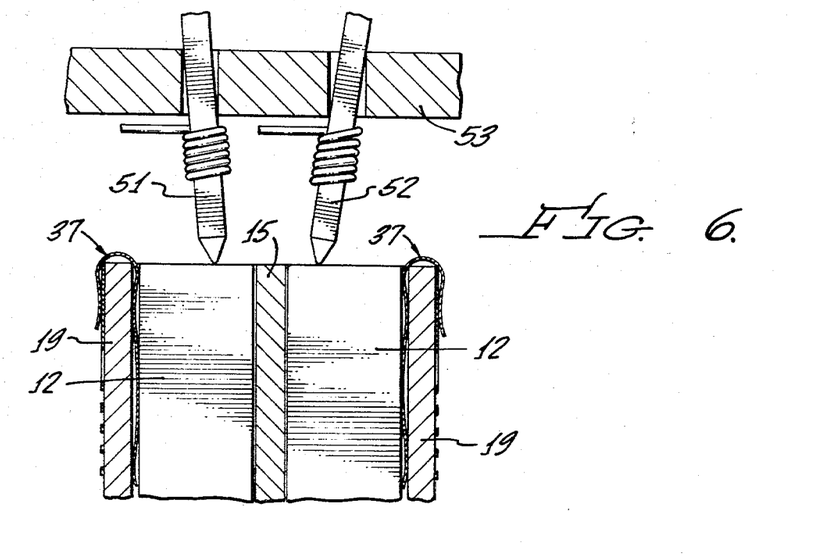

Another advantage to be derived from the present system can be seen from an inspection of FIG. 6. That is, a major industry problem is the necessity of straightening wire wrap leads so that reliable electrical and mechanical contact can be made to a PC board under test. With the present test fixture, the square pins reduce the need for component lead straightness because a square pin provides 41% more probe area than a round pin.

More specifically, FIG. 6 shows a pair of bent wire wrapped leads 51 and 52 extending from a circuit board 53 and positioned to engage pins 12. Because of the increased area of pins 12, there is significantly reduced necessity to straighten leads 51 and 52. Also, the square compartments 18 disallow rotational movement, preventing pins 12 from touching one another and shorting. Pins 12 may be made flush with the top of members 15 and 19, thereby permitting the use of larger pins as the surrounding compartment 18 fully insulates each pin.

Also, and as shown in FIG. 6, if a still smaller center-to-center spacing is required between adjacent rows of pins 12, member 15 may be made with portions 17 extending from both sides thereof to define two series of parallel, spaced, U-shaped channels 18. By placing a circuit board 19 on opposite sides thereof, both series of channels are enclosed.

While the invention has been described with respect to preferred physical embodiments constructed in accordance therewith, it will be apparent to those skilled in the art that various modifications and improvements may be made without departing from the scope and spirit of the invention. Accordingly, it is to be understood that the invention is not to be limited by the specific illustrative embodiments, but only by the scope of the appended claims.

I claim:

1. In a test fixture of the type including a bed of pins, first ends of which are adapted to contact a product under test, means for supporting said pins, and means for making electrical connection to said pins, said pins being solid members freely slidable in said supporting means, the improvement comprising:
    a first sheet of resilient material engaging second ends of all of said pins for providing a force to urge said first ends of said pins into contact with said product under test; and
    a second sheet of resilient material engaging the surface of said first sheet opposite from the surface thereof which engages said pins, said second sheet being more flexible than said first sheet to permit movement of said first sheet for different lengths of travel of different ones of said pins.

2. In a test fixture according to claim 1, the improvement wherein some of said pins have lengths different than others of said pins.

3. In a test fixture according to claim 1 or 2, the improvement wherein said supporting means comprises:
    a first elongate, generally rectangular member including a wall and a plurality of parallel, spaced partitions extending perpendicularly from one side of said wall so as to define a series of parallel, spaced channels which extend perpendicular to the longitudinal dimension of said wall; and
    a second elongate, generally rectangular member positionable parallel to said first member, adjacent the free ends of said partitions, said pins being positioned in said channels, for movement therethrough.

4. In a test fixture according to claim 3, the improvement wherein said second member includes a pattern of conductive leads for conducting electrical signals to said pins; and wherein said means for making electrical connection to said pins comprises:
    a plurality of parallel, spaced contacts connected to said second member, along a longitudinal side edge thereof, the spacing between said contacts being the same as the spacing between said channels whereby a contact is aligned with each of said channels, each of said contacts being electrically connected to one of said conductive leads and being positioned to contact one of said pins for completing an electrical circuit therebetween.

5. In a test fixture according to claim 4, the improvement wherein said second member includes a series of parallel, spaced terminals positioned along an edge thereof remote from said series of contacts, said conductive leads connecting each of the contacts of said series of contacts to corresponding ones of the terminals of said series of terminals.

6. In a test fixture according to claim 5, the improvement wherein said pattern of conductive leads is on a side of said second member opposite the side thereof which is adjacent said free ends of said partitions.

7. In a test fixture according to claim 6, the improvement wherein each of said contacts is a generally hook-shaped member extending over said longitudinal side edge of said second member so as to contact one of said conductive leads, the body of each hook shaped member extending into and along a channel to be engaged by a pin therein as said pin moves therethrough.

8. In a test fixture according to claim 3, the improvement wherein said supporting means comprises:
    a plurality of said first members and a plurality of said second members positioned in a stacked array to provide a two dimensional series of channels for support of said pins to provide a test fixture for testing a two-dimensional product.

9. In a test fixture of the type including a bed of pins adapted to contact a product under test, means for supporting said pins for slidable movement in a direction perpendicular to said product under test, and means for making electrical connection to said pins, the improvement wherein said supporting means comprises:

a first elongate, generally rectangular member including a wall and a series of parallel, spaced partitions extending perpendicularly from one side of said wall so as to define a series of parallel, spaced channels which extend perpendicular to the longitudinal dimension of said wall;

a second elongate, generally rectangular member positionable parallel to said first member, adjacent the free ends of said partitions;

a plurality of pins, individual ones of said pins being positioned in individual ones of said channels, between said wall of said first member and said second member, the ends of said pins adapted to contact said product extending externally of said channels, beyond the longitudinal side edges of said first and second members, said second member including a pattern of conductive leads for conducting electrical signals to said pins; and means for applying a longitudinal spring force to each of said pins to urge said pins in the direction of said ends thereof which contact said product; and wherein said means for making electrical connection to said pins comprises:

a series of parallel, spaced contacts connected to said second member, along said longitudinal side edge thereof, the spacing between said contacts being the same as the spacing between said channels whereby a contact is aligned with each of said channels, each of said contacts being electrically connected to a different one of said conductive leads and being positioned to contact a different one of said pins for completing an electrical circuit therebetween.

10. In a test fixture according to claim 9, the improvement wherein said pins are solid members freely slidable within said channels.

11. In a test fixture according to claim 10, the improvement wherein said spring force applying means comprises:

a first sheet of resilient material engaging the ends of said pins which do not contact said product for providing a force to urge said pins into contact with said product.

12. In a test fixture according to claim 11, the improvement further comprising:

a second sheet of resilient material engaging the surface of said first sheet opposite from the surface thereof which engages said pins, said second sheet being more flexible than said first sheet to permit movement of said first sheet for different lengths of travel of said pins.

13. In a test fixture according to claim 11, the improvement wherein said second member includes a series of parallel, spaced terminals positioned along an edge thereof remote from said series of contacts, said conductive leads connecting each of the contacts of said series of contacts to corresponding ones of the terminals of said series of terminals.

14. In a test fixture according to claim 13, the improvement wherein said pattern of conductive leads is on a side of said second member opposite the side thereof which is adjacent said free ends of said partitions.

15. In a test fixture according to claim 14, the improvement wherein each of said contacts is a generally hook-shaped member extending over said longitudinal side edge of said second member so as to contact one of said conductive leads, the bodies of said hook-shaped members extending into and along said channels to be engaged by said pins as said pins move therethrough.

16. In a test fixture according to claim 13, the improvement wherein said supporting means further comprises:

a plurality of said first members and a plurality of said second members positioned in a stacked array to provide a two dimensional series of channels for support of said pins to provide a test fixture for testing a two-dimensional product.

17. In a test fixture according to claim 9, the improvement wherein said channels have a rectangular cross section and said pins have a corresponding rectangular cross section.

18. In a test fixture according to claim 9, the improvement wherein the cross section of said channels is non-circular and wherein the cross section of said pins corresponds to that of said channels.

19. In a test fixture according to claim 9, the improvement wherein said force applying means comprises:

a plurality of springs, one for each of said pins.

20. Apparatus including a plurality of pins in parallel, spaced relationship, said pins extending perpendicularly through a plane so as to contact a product to be tested positioned parallel to said plane, comprising:

a first elongate, generally rectangular member including a wall having a series of parallel, spaced partitions extending perpendicularly from one side thereof so as to define a series of parallel, spaced channels which extend perpendicular to the longitudinal dimension of said wall, one longitudinal side edge of said second member being in said plane, the ends of said channels in said plane being open;

a second elongate, generally rectangular member positionable parallel to said first member, adjacent the free ends of said partitions, one longitudinal side edge of said second member being parallel to and adjacent said one side edge of said first member;

a plurality of pins, individual ones of said pins being positioned in individual ones of said channels, between said wall of said first member and said second member, said pins being slidable in said channels and extending through said plane, said second member including a pattern of electrical leads for conducting electrical signals to said pins;

a series of parallel, spaced contacts connected to said second member, along said one side edge thereof, the spacing between said contacts being the same as the spacing between said channels whereby a contact is aligned with each of said channels, each of said contacts being electrically connected to a different one of said electrical leads and being positioned to contact a different one of said pins for completing an electrical circuit therebetween; and means for applying a longitudinal spring force to each of said pins to urge said pins in the direction of the ends thereof adapted to contact said product to be tested.

21. Apparatus according to claim 20, the improvement wherein said second member includes a series of parallel, spaced terminals positioned along an edge thereof remote from said series of contacts, said electrical leads connecting each of the contacts of said series of contacts to corresponding ones of the terminals of said series of terminals.

22. Apparatus according to claim 20 or 21, further comprising:
a plurality of said first members and a plurality of said second members positioned in a stacked array to provide a two-dimensional series of parallel channels for support of said pins.

23. A test fixture comprising:
an elongate, generally rectangular panel having a plurality of parallel, spaced partitions extending perpendicularly from one side thereof so as to define a series of parallel, spaced channels, one longitudinal side edge of said panel lying in a given plane, the ends of said channels in said plane being open;
a generally planar member positioned parallel to said panel, adjacent the free ends of said partitions, so as to enclose the sides of said channels, one longitudinal side edge of said planar member being parallel to and adjacent said one side edge of said panel;
a plurality of pins, individual ones of said pins being positioned in individual ones of said channels, said pins being slidable in said channels and extending through said given plane, said planar member including a pattern of electrical leads for conducting electrical signals to said pins;
means for applying a longitudinal spring force to each of said pins to urge said pins in the direction of the ends thereof which extend through said given plane; and
a series of parallel, spaced contacts connected to said planar member, along said one side edge thereof, the spacing between said contacts being the same as the spacing between said channels whereby a contact is aligned with each of said channels, each of said contacts being electrically connected to a different one of said electrical leads and being positioned to contact a different one of said pins for completing an electrical circuit therebetween.

24. A test fixture according to claim 23, wherein said planar member includes a series of parallel, spaced terminals positioned along an edge thereof remote from said series of contacts, said electrical leads connecting each of the contacts of said series of contacts to different ones of the terminals of said series of terminals.

25. A test fixture according to claim 23 or 24, further comprising:
a plurality of said panels and a plurality of said planar members positioned in a stacked array to provide a two-dimensional series of parallel channels for support of said pins.

26. A test fixture including a plurality of pins in parallel, spaced relationship, said pins extending perpendicularly through a plane so as to contact a product to be tested, comprising:
a plurality of first elongate, generally rectangular, planar members positioned in parallel, spaced relationship, perpendicular to said plane, one longitudinal side edge of each of said members being in said plane, each of said members defining a series of parallel, spaced, elongate channels which extend perpendicular to said plane, the ends of said channels in said plane being open;
a plurality of second elongate, generally rectangular, planar members positioned in parallel, spaced relationship, perpendicular to said plane, between adjacent first members, one longitudinal side edge of each of said second members being parallel to and adjacent said one side edges of said first members;
a plurality of pins, individual ones of said pins being positioned in individual ones of said channels, said pins being moveable in said channels and extending through said plane, each of said second members including a pattern of electrical leads for conducting electrical signals to said pins;
means for applying a longitudinal spring force to each of said pins to urge said pins in the direction of the ends thereof which contact said product to be tested; and
a series of parallel, spaced contacts connected to each of said second members, along said one side edges thereof, the spacing between said contacts being the same as the spacing between said channels whereby a contact is aligned with each of said channels of an adjacent first member, each of said contacts being electrically connected to a different one of said electrical leads on the same second member and being positioned to contact a different one of the pins of an adjacent first member for completing an electrical circuit therebetween.

27. A test fixture according to claim 26, wherein each said second member includes a series of parallel, spaced terminals positioned along an edge thereof remote from said series of contacts, said electrical leads connecting different ones of the contacts of said series of contacts to different ones of the terminals of said series of terminals on the same second member.

* * * * *

UNITED STATES PATENT OFFICE
CERTIFICATE OF CORRECTION

Patent No. 4,340,858          Dated  July 20, 1982

Inventor(s)   JAMES T. MALLOY

It is certified that error appears in the above-identified patent and that said Letters Patent are hereby corrected as shown below:

Column 12, Claim 26, line 36, delete "edges" and insert -- edge --;

Column 12, Claim 26, line 24, delete "edges" and insert -- edge --.

Signed and Sealed this

Fifteenth Day of March, 1988

Attest:

DONALD J. QUIGG

*Attesting Officer*     Commissioner of Patents and Trademarks